US009466815B2

(12) United States Patent
Chung et al.

(10) Patent No.: US 9,466,815 B2
(45) Date of Patent: Oct. 11, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Jin Koo Chung, Suwon-si (KR); Kyung Ho Kim, Seoul (KR); Sang Hoon Yim, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/308,861

(22) Filed: Jun. 19, 2014

(65) Prior Publication Data

US 2015/0041777 A1 Feb. 12, 2015

(30) Foreign Application Priority Data

Aug. 8, 2013 (KR) .......................... 10-2013-0094418

(51) Int. Cl.
*H01L 33/10* (2010.01)
*H01L 51/52* (2006.01)
*H01L 27/32* (2006.01)

(52) U.S. Cl.
CPC ....... *H01L 51/5271* (2013.01); *H01L 27/3244* (2013.01); *H01L 2251/5315* (2013.01)

(58) Field of Classification Search
None
See application file for complete search history.

(56) References Cited

U.S. PATENT DOCUMENTS

2001/0030507 A1* 10/2001 Ono ............................. 313/504
2012/0299472 A1  11/2012 Chung et al.
2013/0299808 A1* 11/2013 Sugimoto et al. ............ 257/40

FOREIGN PATENT DOCUMENTS

JP    2001-257079 A    9/2001
JP        4964605 B2    4/2012
KR     10-1015845 B1   2/2011

* cited by examiner

*Primary Examiner* — Whitney T Moore
*Assistant Examiner* — Scott R Wilson
(74) *Attorney, Agent, or Firm* — Lee & Morse, P.C.

(57) ABSTRACT

An organic light emitting diode display includes a display substrate including a first substrate and a plurality of pixel light emitting units on the first substrate, and an encapsulation substrate including a second substrate facing the display substrate, and a main reflecting member on the second substrate, the main reflecting member including a light emitting opening at a position corresponding to at least one of the pixel light emitting units, and an auxiliary opening dividing the main reflecting member into a plurality of sub-reflecting members.

18 Claims, 9 Drawing Sheets

ORGANIC LIGHT EMITTING DIODE DISPLAY

CROSS-REFERENCE TO RELATED APPLICATION

Korean Patent Application No. 10-2013-0094418, filed on Aug. 8, 2013, in the Korean Intellectual Property Office, and entitled: "Organic Light Emitting Diode Display," is incorporated by reference herein in its entirety.

BACKGROUND

1. Field

The present disclosure relates to an organic light emitting diode display.

2. Description of the Related Art

An organic light emitting diode display includes an organic light emitting diode (OLED), which is configured of an organic emission layer between two electrodes, and forms excitons by combining electrons injected from one electrode with holes injected from another electrode at the organic emission layer and emits light by allowing the excitons to emit energy. The organic light emitting diode display also includes a display substrate, on which the OLED is formed, and an encapsulation substrate encapsulating the display substrate and including a reflecting member to perform a mirror function while the OLED does not emit light

SUMMARY

An exemplary embodiment provides an organic light emitting diode display including a display substrate including a first substrate and a plurality of pixel light emitting units on the first substrate, and an encapsulation substrate including a second substrate facing the display substrate, and a main reflecting member on the second substrate, the main reflecting member including a light emitting opening at a position corresponding to at least one of the pixel light emitting units, and an auxiliary opening dividing the main reflecting member into a plurality of sub-reflecting members.

The organic light emitting diode display may further include: an auxiliary reflecting member which is formed at a position corresponding to the auxiliary opening.

The auxiliary reflecting member may be formed on the first substrate and may enclose at least one of the pixel light emitting units.

The auxiliary opening and the auxiliary reflecting member may each have a straight shape or a net shape.

The auxiliary opening and the auxiliary reflecting member may each enclose the light emitting opening and the pixel light emitting unit.

The plurality of pixel light emitting units may include a plurality of dot light emitting units which include a first color light emitting unit, a second color light emitting unit, and a third color light emitting unit.

The auxiliary opening and the auxiliary reflecting member may each enclose the light emitting opening and the dot light emitting unit.

The auxiliary opening and the auxiliary reflecting member may each enclose the plurality of light emitting opening and the plurality of dot light emitting units.

The pixel light emitting unit may include a first electrode formed on the first substrate, an organic emission layer formed on the first electrode, and a second electrode formed on the organic emission layer, and the auxiliary reflecting member may be formed on the same layer as the first electrode.

The auxiliary reflecting member may be formed on the second substrate and may enclose at least one of the pixel light emitting units.

The auxiliary opening and the auxiliary reflecting member may each have a straight shape or a net shape.

The auxiliary opening and the auxiliary reflecting member may each enclose the light emitting opening.

The plurality of pixel light emitting units may include a plurality of dot light emitting units which include a first color light emitting unit, a second color light emitting unit, and a third color light emitting unit.

The auxiliary opening and the auxiliary reflecting member may each enclose the light emitting opening.

The auxiliary opening and the auxiliary reflecting member may each enclose the plurality of light emitting openings.

The auxiliary reflecting member may be formed on an overcoat which covers the main reflecting member and may overlap the auxiliary opening.

The main reflecting member may include a plurality of individual sub-reflecting members defined by the auxiliary opening, the auxiliary reflecting member overlapping the entire auxiliary opening.

BRIEF DESCRIPTION OF THE DRAWINGS

Features will become apparent to those of ordinary skill in the art by describing in detail exemplary embodiments with reference to the attached drawings. in which.

DETAILED DESCRIPTION

Figure 1:
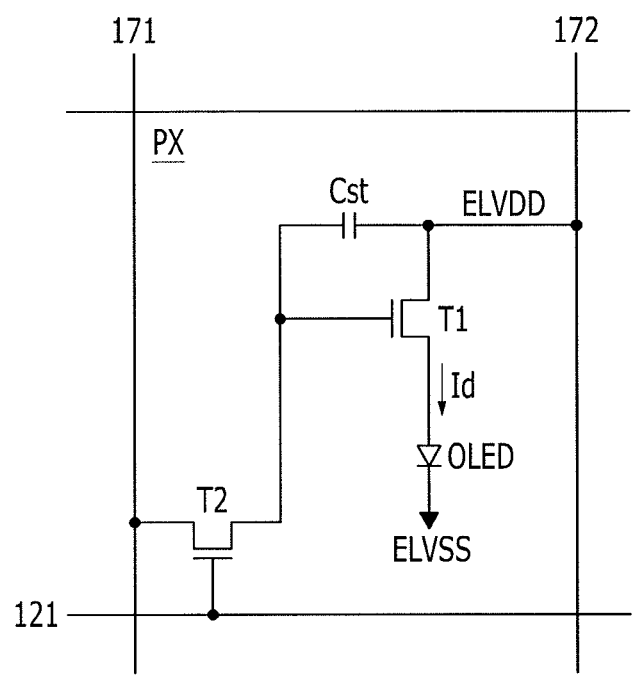
FIG. 1 illustrates an equivalent circuit diagram of an organic light emitting diode display according to an exemplary embodiment.

Hereinafter, the present disclosure will be described more fully with reference to the accompanying drawings, in which exemplary embodiments are shown. As those skilled in the art would realize, the described embodiments may be modified in various different ways, all without departing from the spirit or scope of the present disclosure. Rather, these embodiments are provided so that this disclosure will be thorough and complete, and will fully convey exemplary implementations to those skilled in the art.

In order to clearly describe the present disclosure, portions that are not connected with the description will be omitted. Like reference numerals designate like elements throughout the specification.

In addition, the size and thickness of each configuration shown in the drawings is shown for understanding and ease of description, but the present disclosure is not necessarily limited thereto. For example, in the drawings, the thickness of layers, films, panels, regions, etc., may be exaggerated for clarity. It will also be understood that when an element such as a layer, film, region, or substrate is referred to as being "on" another element, it can be directly on the other element or intervening elements may also be present.

Further, an active matrix (AM) type organic light emitting diode display having a 2Tr (Transistor) 1Cap (Capacitor) structure in which two thin film transistors (TFTs) and one capacitor are included in one pixel is illustrated in the accompanying drawings, but the present disclosure is not limited thereto. Therefore, in the organic light emitting diode display according to example embodiments, one pixel may include a plurality of thin film transistors and at least one capacitor and may be further be provided with a separate wiring or may also be formed to have various structures in which the existing wiring is omitted. Here, one pixel refers to a minimum unit which displays an image, and the organic light emitting diode display displays an image through a plurality of pixels.

Figure 2:
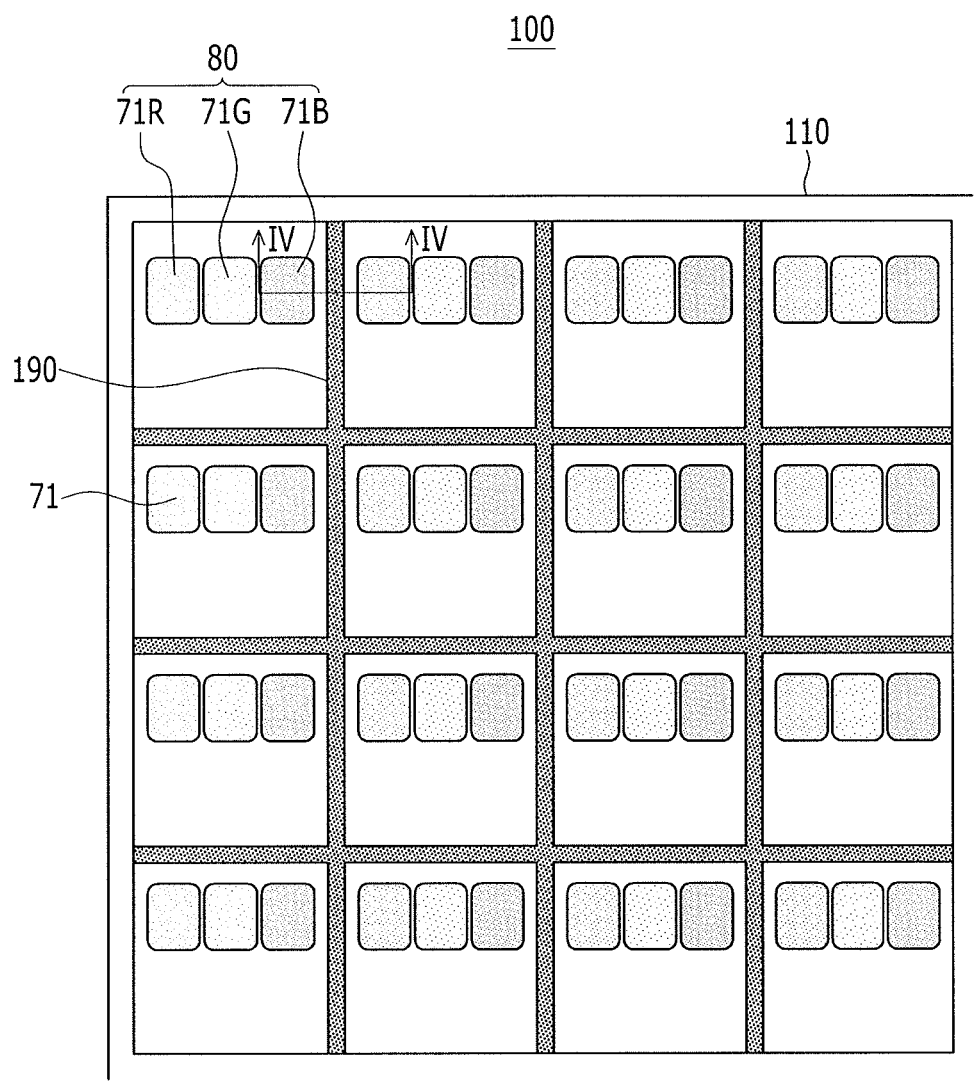
FIG. 2 illustrates a plan view of a display substrate of the organic light emitting diode display according to the exemplary embodiment.
Figure 3:
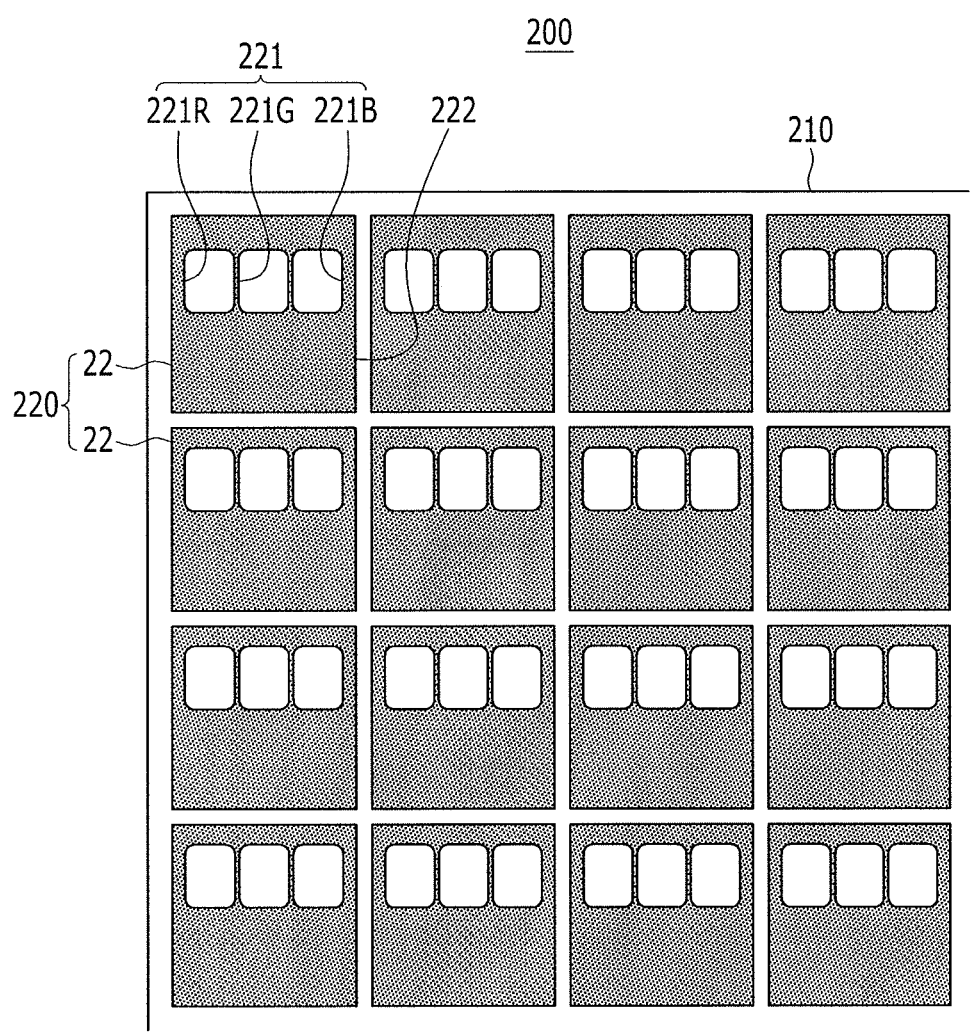
FIG. 3 illustrates a plan view of an encapsulation substrate of the organic light emitting diode display according to the exemplary embodiment.
Figure 4:
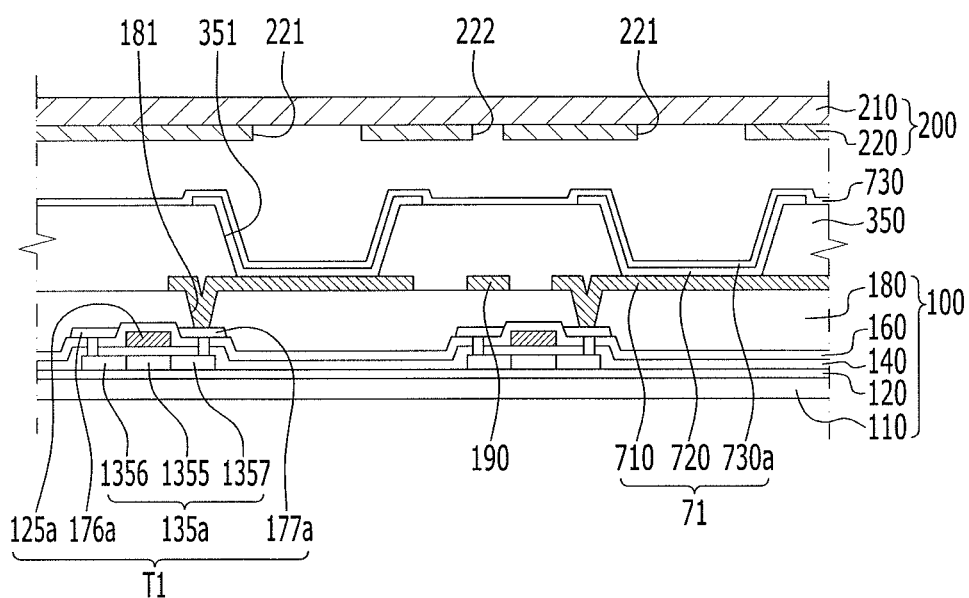
FIG. 4 illustrates a cross-sectional view taken along line IV-IV of FIGS. 2 and 3.

Next, the organic light emitting diode display according to the exemplary embodiment will be described in detail with reference to FIGS. 1 to 4. FIG. 1 illustrates an equivalent circuit diagram of an organic light emitting diode display according to an exemplary embodiment, FIG. 2 illustrates a plan view of a display substrate of the organic light emitting diode display according to the exemplary embodiment, FIG. 3 illustrates a plan view of an encapsulation substrate of the organic light emitting diode display according to the exemplary embodiment, and FIG. 4 illustrates a cross-sectional view along line IV-IV of FIGS. 2 and 3.

As illustrated in FIG. 1, the organic light emitting diode display according to the exemplary embodiment includes a plurality of signal lines 121, 171 and 172, and a plurality of pixels PXs which are connected to the signal lines and are arranged in a substantial matrix form.

The signal lines include a plurality of scan lines 121 which transfer scan signals (or gate signals), a plurality of data lines 171 which transfer data signals, and a plurality of driving voltage lines 172 which transfer a driving voltage ELVDD. The scan lines 121 extend substantially in a row direction and are substantially parallel with each other and the data line 171 and the driving voltage line 172 extend substantially in a column direction and are substantially parallel with each other. Each pixel PX includes a switching thin film transistor T2, a driving thin film transistor T1, a storage capacitor Cst, and an organic light emitting diode (OLED).

The switching thin film transistor T2 includes a control terminal, an input terminal, and an output terminal, in which the control terminal is connected to the scan line 121, the input terminal is connected to the data line 171, and the output terminal is connected to the driving thin film transistor T1. The switching thin film transistor T2 transfers the data signal applied to the data line 171 to the driving thin film transistor T1 in response to the scan signal applied to the scan line 121.

The driving thin film transistor T1 also has a control terminal, an input terminal, and an output terminal, in which the control terminal is connected to the switching thin film transistor T2, the input terminal is connected to the driving voltage line 172, and the output terminal is connected to the organic light emitting diode (OLED). The driving thin film transistor T1 moves an output current Id, of which the magnitude varies depending on a voltage applied between the control terminal and the output terminal.

The storage capacitor Cst is connected between the control terminal and the input terminal of the driving thin film transistor T1. The storage capacitor Cst charges the data signal applied to the control terminal of the driving thin film transistor T1 and maintains the charged data signal even after the switching thin film transistor T2 is turned off.

The organic light emitting diode (OLED) has an anode connected to the output terminal of the driving thin film transistor T1 and a cathode connected to a common voltage (ELVSS). The organic light emitting diode (OLED) emits light of which the intensity varies depending on the output current Id of the driving thin film transistor T1 to display an image.

The switching thin film transistor T2 and the driving thin film transistor T1 may be an n-channel field effect transistor (FET) or a p-channel field effect transistor. Further, a connection relationship of the thin film transistors T1 and T2, the storage capacitor Cst, and the organic light emitting diode (OLED) may be changed.

Next, a detailed structure of the organic light emitting diode display illustrated in FIG. 1 will be described in detail with reference to FIGS. 2 to 4, along with FIG. 1.

As illustrated in FIGS. 2 and 4, the organic light emitting diode display according to the exemplary embodiment may include a display substrate 100, which emits light, and an encapsulation substrate 200, which faces the display substrate 100 and encapsulates the display substrate 100.

Referring to FIG. 4, the display substrate 100 may include a first substrate 110, a plurality of pixel light emitting units 71 which are formed on the first substrate 110 and allow the organic light emitting diode (OLED) to emit light, and an auxiliary reflecting member 190 which encapsulates the plurality of pixel light emitting units 71.

The pixel light emitting unit 71 may include a pixel electrode 710 which is a first electrode formed on the first substrate 110, a pixel defined layer 350 which covers an edge of the pixel electrode 710 and exposes the pixel electrode 710 through a pixel opening 351, an organic emission layer 720 which is formed on the pixel electrode 710, and a common electrode light emitting unit 730a which is a part of a common electrode 730 which is a second electrode formed on the organic emission layer 720. Referring to FIG. 2, the plurality of pixel light emitting units 71 may form a dot light emitting unit 80 which includes a red light emitting unit 71R which is a first color light emitting unit, a green light emitting unit 71G which is a second color light emitting unit, and a blue light emitting unit 71B which is a third color light emitting unit.

As illustrated in FIG. 2, the auxiliary reflecting member 190 encloses the dot light emitting unit 80 and may have a net shape, e.g., a grid shape. As illustrated in FIG. 4, the auxiliary reflecting member 190 may be formed on a same layer as the pixel electrode 710. The auxiliary reflecting member 190 may be made of metal having high reflectance, e.g., silver (Ag), aluminum (Al), and/or magnesium (Mg).

It is noted that while FIG. 2 illustrates one exemplary embodiment of the auxiliary reflecting member 190 having a net shape, embodiments are not limited thereto. For example, the auxiliary reflecting member 190 may have a straight shape, e.g., a linear striped shape.

The encapsulation substrate 200 may include a second substrate 210, which faces the display substrate 100, and a main reflecting member 220, which is formed on the second substrate 210.

As illustrated in FIGS. 3-4, the main reflecting member 220 includes a light emitting opening 221, which is formed at a position corresponding to the pixel light emitting unit 71, and an auxiliary opening 222, which is formed at a position corresponding to the auxiliary reflecting member 190. For example, the main reflecting member 220 overlaps a majority of the display substrate 100, with the exception of portions exposed by the light emitting opening 221 and the auxiliary opening 222. The main reflecting member 220 may be made of metal having high reflectance, e.g., silver (Ag), aluminum (Al), and magnesium (Mg).

As illustrated in FIG. 3, the light emitting opening 221 includes a red light emitting opening 221R which corresponds to, e.g., overlaps, the red light emitting unit 71R, a green light emitting opening 221G which corresponds to the green light emitting unit 71G, and a blue light emitting opening 221B which corresponds to the blue light emitting unit 71B. In other words, the main reflecting member 220 exposes the pixel light emitting unit 71, so light emitted from the pixel light emitting unit 71 through the light emitting opening 221 is emitted to the outside.

As further illustrated in FIG. 3, the auxiliary opening 222 has a net, e.g., grid, shape to divide the main reflecting member 220 into a plurality of sub-reflecting members 22. For example, the auxiliary opening 222 may have a grid pattern dividing the main reflecting member 220 into a plurality of individual sub-reflecting members 22, e.g., completely disconnected from each other, arranged in a matrix pattern. For example, the auxiliary opening 222 and the auxiliary reflecting member 190 may overlap, e.g., completely overlap, each other.

The main reflecting member 220 may reflect external light incident thereon, i.e., reflect light directed toward the pixel light emitting unit 71 from the outside. Therefore, the main reflecting member 220 reflects external light away from the encapsulation substrate 200, i.e., serves as a mirror while the pixel light emitting unit 71 does not emit light. Further, since the main reflecting member 220 is formed in a region which does not correspond to the pixel light emitting unit 71, e.g., in a region not overlapping with the pixel light emitting unit 71, the main reflecting member 220 may secure a path for the light emitted from the pixel light emitting unit 71 to be emitted through the pixel opening 351 without interference.

In addition, since the main reflecting member 220 includes the auxiliary opening 222, it is possible to prevent distortion of the encapsulation substrate 200. In contrast, since a conventional reflecting member, e.g., which is made of metal, and the second substrate 210, e.g., which is made of glass, have different coefficients of thermal expansion, the conventional reflecting member, i.e., without the auxiliary opening 222, may be warped before and after a heat treatment process due to the different coefficients of thermal expansion.

Further, the auxiliary reflecting member 190 overlaps the auxiliary opening 222 to supplement the reflecting function at the auxiliary opening 222. In other words, since the auxiliary reflecting member 190 is positioned under the auxiliary opening 222 and to correspond to, e.g., overlap, the auxiliary opening 222, external light transmitted through the second substrate 210 and through the auxiliary opening 222 and directed toward the first substrate 110 is incident on and reflected from the auxiliary reflecting member 190, thereby reflecting external light transmitted through the auxiliary opening 222. As such, even though the main reflecting member 220 includes the auxiliary opening 222, the reflecting function is prevented from deteriorating in the region of the auxiliary opening 222 due to the auxiliary reflecting member 190.

Hereinafter, a detailed structure of the display substrate including the pixel light emitting unit will be described in detail. Herein, the driving thin film transistor is mainly described and the switching thin film transistor is substantially the same as a stacked structure of the driving thin film transistor, and therefore a detailed description thereof will be omitted.

Referring to FIG. 4, a buffer layer 120 may be formed on the first substrate 110. The first substrate 110 may be an insulating substrate, e.g., made of glass, quartz, ceramic, plastic, or the like, or a metallic substrate, e.g., made of stainless steel, and the like. The buffer layer 120 may have a single layer structure, e.g., made of silicon nitride ($SiN_x$), or a double layer structure, e.g., in which silicon nitride ($SiN_x$) and silicon oxide $SiO_2$ are stacked. The buffer layer 120 serves to planarize a surface of the first substrate 110 while preventing permeation of components, e.g., impurities and moisture, into the first substrate 110.

A driving semiconductor layer 135a may be formed on the buffer layer 120. For example, the semiconductor layer 135a may be made of polysilicon or oxide semiconductor, in which the oxide semiconductor may include an oxide of, e.g., titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O), which are composite oxides thereof. When the driving semiconductor layer 135a is made of the oxide semiconductor, a separate protective layer may be added to protect the oxide semiconductor which is vulnerable to external environments, e.g., high temperature.

The driving semiconductor layer 135a includes a channel region, which is not doped with impurities, and a source region and a drain region formed by doping both sides of the channel region with impurities. The impurity varies depending on a kind of the thin film transistor and may be an N-type impurity or a P-type impurity.

The driving semiconductor layer 135a is divided into a channel region 1355 and a source region 1356 and a drain region 1357 which are each formed at both sides of the channel region 1355. The channel region 1355 of the driving semiconductor layer 135a may include polysilicon which is not doped with impurity, i.e., an intrinsic semiconductor, and the source region 1356 and the drain region 1357 of the driving semiconductor layer 135*a* may include polysilicon which is doped with conductive impurity, i.e., impurity semiconductor.

A gate insulating layer 140 is formed on the driving semiconductor layer 135*a*. The gate insulating layer 140 may be a single layer or a plurality of layers including at least one of, e.g., silicon nitride and silicon oxide.

A driving gate electrode 125*a* is formed on the gate insulating layer 140. The driving gate electrode 125*a* overlaps the channel region 1355. An interlayer insulating layer 160 is formed on the driving gate electrode 125*a*. Similar to the gate insulating layer 140, the interlayer insulating layer 160 may be made of, e.g., silicon nitride, silicon oxide, or the like.

A driving source electrode 176*a* and a driving drain electrode 177*a* are formed on the interlayer insulating layer 160. The driving source electrode 176*a* and the driving drain electrode 177*a* are each connected to the source region 1356 and the drain region 1357, respectively. The driving semiconductor layer 135*a*, the driving gate electrode 125*a*, the driving source electrode 176*a*, and the driving drain electrode 177*a* form the driving thin film transistor T1.

A passivation layer 180 is formed on the driving source electrode 176*a* and the driving drain electrode 177*a*. The pixel electrode 710, which is the first electrode, and the auxiliary reflecting member 190 are formed on the passivation layer 180. The pixel electrode 710 is electrically connected to the driving drain electrode 177*a* of the driving thin film transistor T1 through a contact hole 181 formed on the interlayer insulating layer 160, and thus, becomes an anode of the organic light emitting diode (OLED). Further, the auxiliary reflecting member 190 is formed at a position corresponding to the auxiliary opening 222.

The pixel defined layer 350 is formed on the passivation layer 180 and on an edge portion of the pixel electrode 710. The pixel defined layer 350 has the pixel opening 351 which exposes the pixel electrode 710. The pixel defined layer 350 may be made of resin, e.g., polyacrylates and polyimides, silica-based inorganic materials, and the like.

The organic emission layer 720 is formed on a portion of the pixel electrode 710 exposed by the opening 351 of the pixel defined layer 350. The organic emission layer 720 may be formed of a plurality of layers which include at least one of a light emitting layer, a hole-injection layer (HIL), a hole-transporting layer (HTL), an electron-transporting layer (ETL), and an electron-injection layer (EIL). When the organic emission layer 720 includes all of the above layers, the hole injection layer is positioned on the pixel electrode 710, which is an anode, and the hole-transporting layer, the light emitting layer, the electron-transporting layer, and the electron-injection layer may be sequentially stacked on the hole injection layer.

The organic emission layer 720 may include a red organic emission layer which emits red light, a green organic emission layer which emits green light, and a blue organic emission layer which emits blue light, in which the red organic emission layer, the green organic emission layer, and the blue organic emission layer are each formed in a red pixel, a green pixel, and a blue pixel to implement a color image. Further, the organic emission layer 720 may implement the color image by stacking the red organic emission layer, the green organic emission layer, and the blue organic emission layer in all of the red pixel, the green pixel, and the blue pixel and forming a red filter, a green filter, and a blue filter for each pixel.

In another example, the color image may be implemented by forming a white organic emission layer which emits white light in all of the red pixel, the green pixel, and the blue pixel and forming the red filter, the green filter, and the blue filter for each pixel. At the time of implementing the color image using the white organic emission layer and the color filters, there is no need to use a deposition mask for depositing the red organic emission layer, the green organic emission layer, and the blue organic emission layer on each pixel, that is, the red pixel, the green pixel, and the blue pixel. The white organic emission layer may be formed of a single organic emission layer and may be configured to emit white light by stacking the plurality of organic emission layers. For example, the white organic emission layer may also include a configuration to emit white light by combining at least one yellow organic emission layer with at least one blue organic emission layer, a configuration to emit white light by combining at least one cyan organic emission layer with at least one red organic emission layer, and a configuration to emit white light by combining at least one magenta organic emission layer with at least one green organic emission layer, and the like.

The common electrode 730, which is a second electrode, is formed on the pixel defined layer 350 and on the organic emission layer 720. The common electrode 730 becomes a cathode of the organic light emitting diode (OLED). The pixel electrode 710, the organic emission layer 720, and the common electrode 730 form the organic light emitting diode (OLED) 70. The pixel electrode 710, the organic emission layer 720, and a common electrode light emitting unit 730*a*, which is a part of the common electrode 730, overlap each other to form the pixel light emitting unit 71 which emits light.

According to the exemplary embodiment in FIGS. 2-4, the auxiliary opening 222 encloses a single dot light emitting unit 80. However, according to another exemplary embodiment, the auxiliary opening 222 may enclose a plurality of dot light emitting units, as will be described in detail with reference to FIGS. 5-6.

Figure 5:
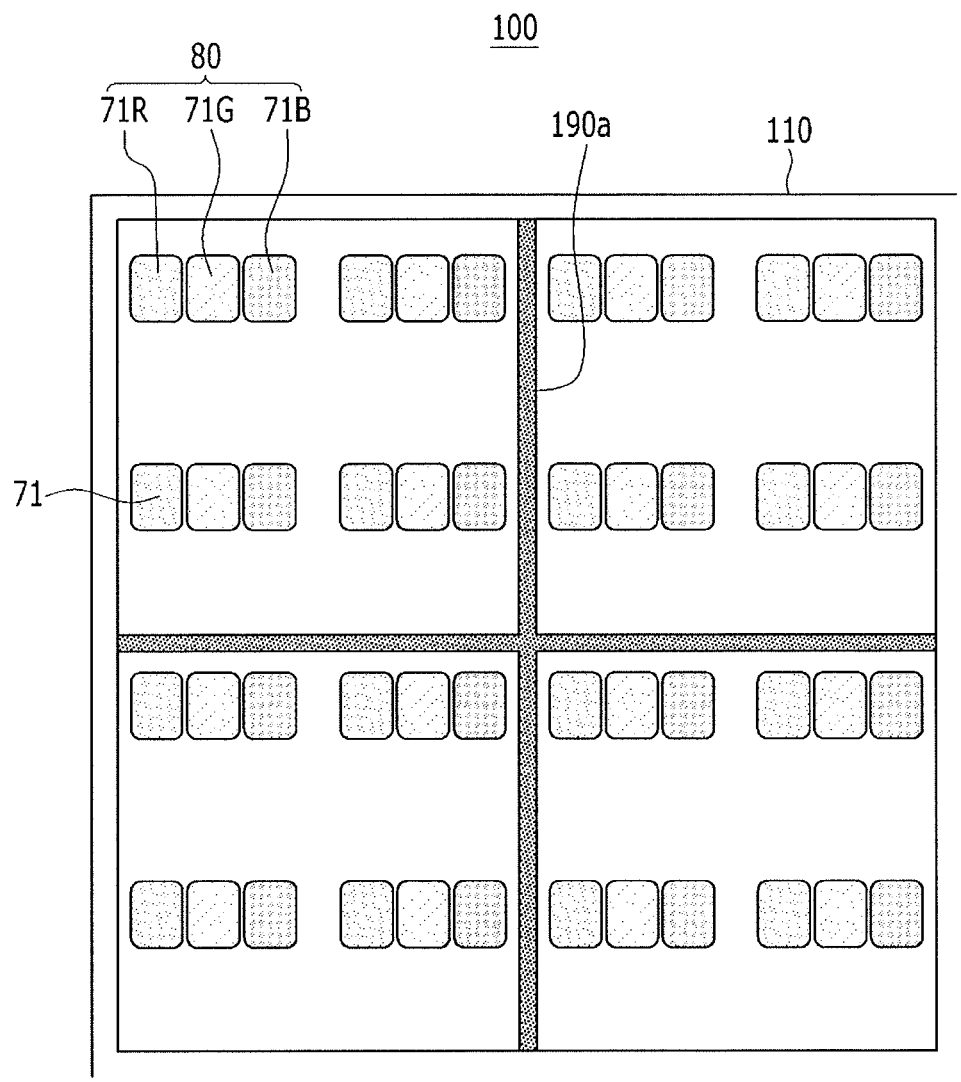
FIG. 5 illustrates a plan view of a display substrate of an organic light emitting diode display according to another exemplary embodiment.
Figure 6:
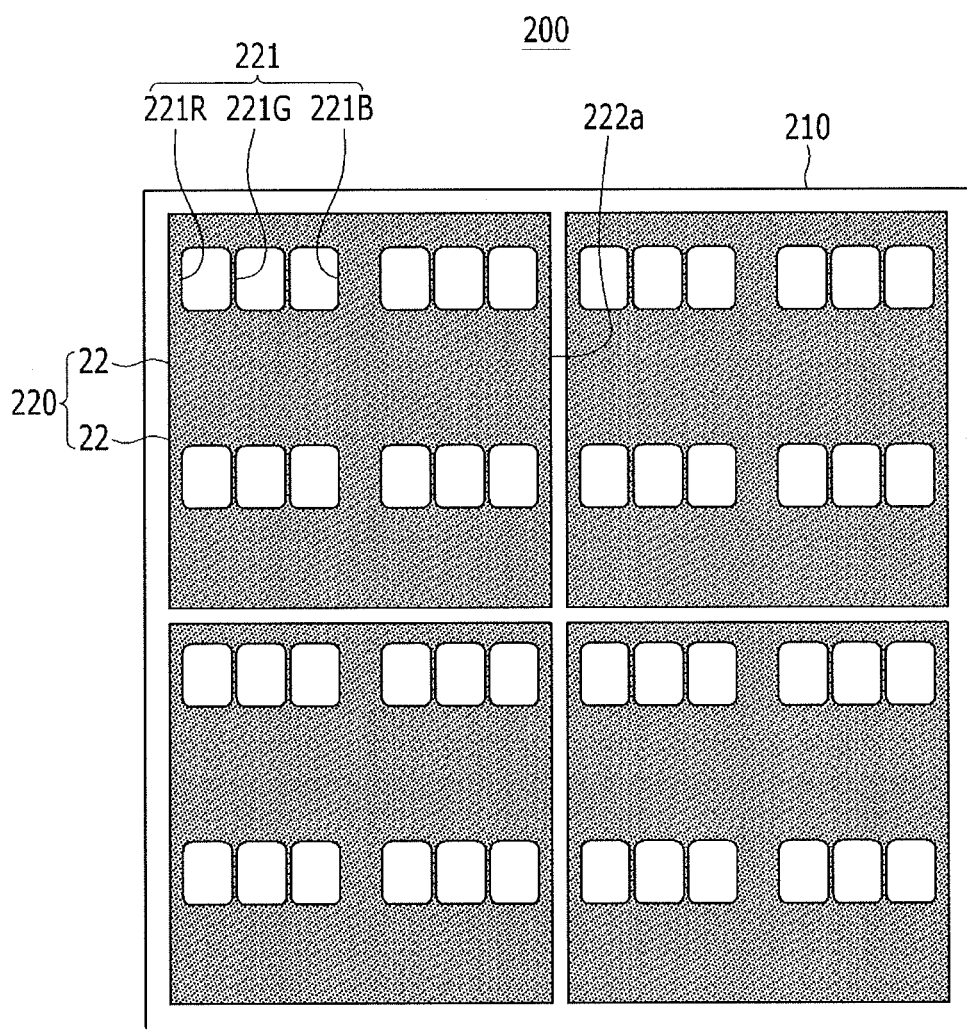
FIG. 6 illustrates a plan view of an encapsulation substrate of an organic light emitting diode display according to another exemplary embodiment.

FIG. 5 illustrates a plan view of a display substrate of an organic light emitting diode display according to another exemplary embodiment, and FIG. 6 illustrates a plan view of an encapsulation substrate of an organic light emitting diode display according to the other exemplary embodiment. The organic light emitting diode display in FIGS. 5-6 is substantially the same as the organic light emitting diode display described previously with reference to FIGS. 2-4, except for the structures of the auxiliary opening and the auxiliary reflecting member, i.e., except for the number of dot light emitting unit 80 enclosed, e.g., surrounded, by the auxiliary opening and the auxiliary reflecting member. Descriptions of same elements will not be repeated.

As illustrated in FIGS. 5 and 6, the display substrate 100 of the organic light emitting diode display according to another exemplary embodiment may include the dot light emitting units 80 on the first substrate 110, the red light emitting unit 71R, the green light emitting unit 71G, and the blue light emitting unit 71B, and an auxiliary reflecting member 190*a* enclosing four dot light emitting units 80. The auxiliary reflecting member 190*a* has a net shape and may be formed on the same layer as the pixel electrode 710.

The encapsulation substrate 200 includes the second substrate 210, which faces the display substrate 100, and the main reflecting member 220 which is formed on the second substrate 210. The main reflecting member 220 includes the light emitting opening 221, which is formed at a position corresponding to the pixel light emitting unit 71, and an auxiliary opening 222a, which is formed at a position corresponding to the auxiliary reflecting member 190a. The auxiliary opening 222a has a net shape to divide the main reflecting member 220 into a plurality of sub-reflecting members 22. In this case, the auxiliary opening 222a is formed to enclose the four dot light emitting units 80 enclosed by the auxiliary reflecting member 190a.

While FIG. 5 illustrates the auxiliary reflecting member 190a which encloses four dot light emitting units 80, example embodiments are not limited thereto. That is, the auxiliary reflecting member 190a may enclose any suitable number of dot light emitting units 80. As such, an area of the auxiliary opening 222a may be adjusted, e.g., reduced, by forming the auxiliary reflecting member 190a and the auxiliary opening 222a which enclose the plurality of dot light emitting units 80, such that the deterioration in the reflecting function may be minimized.

According to the exemplary embodiments described previously, the auxiliary reflecting member is formed on the display substrate 100. However, embodiments are not limited thereto, e.g., the auxiliary reflecting member may be formed on the encapsulation substrate 200, as will be described with reference to FIGS. 7-9.

Figure 7:
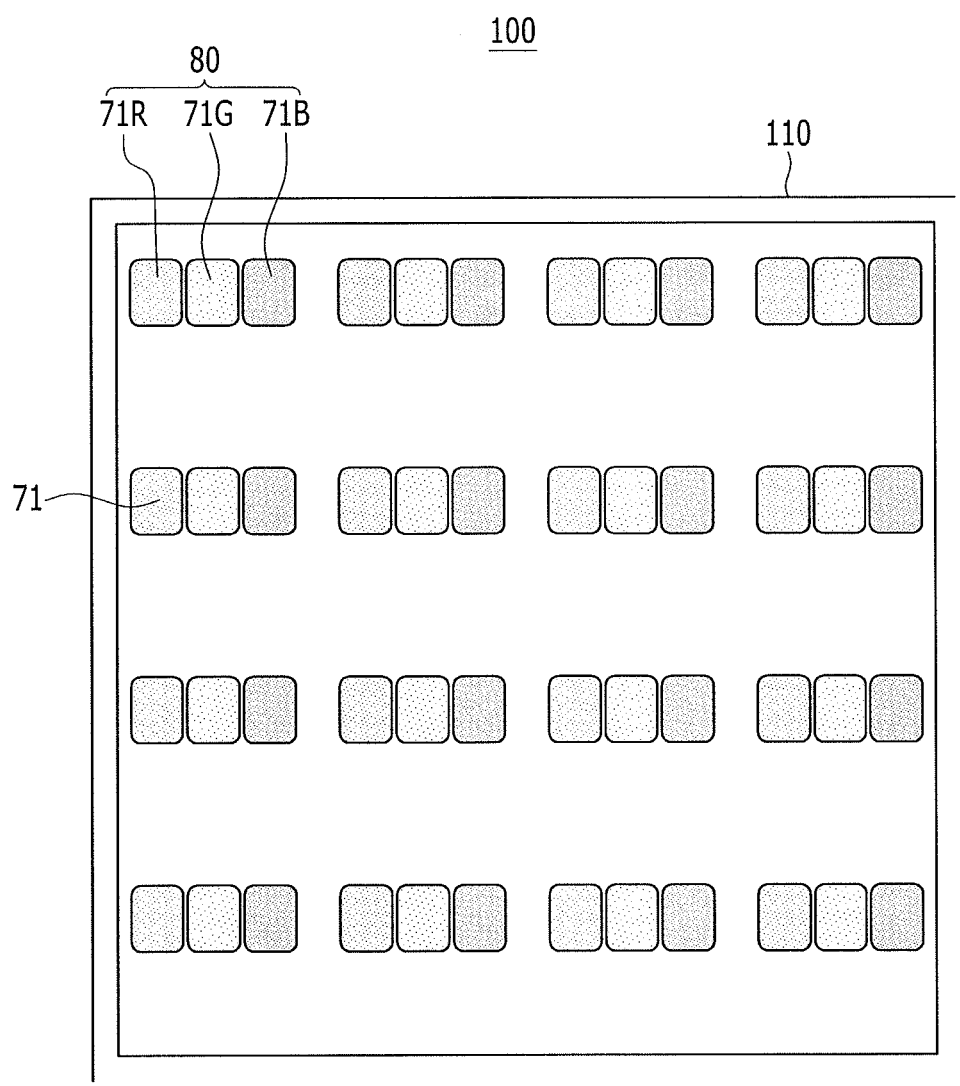
FIG. 7 illustrates a plan view of a display substrate of an organic light emitting diode display according to yet another exemplary embodiment.
Figure 8:
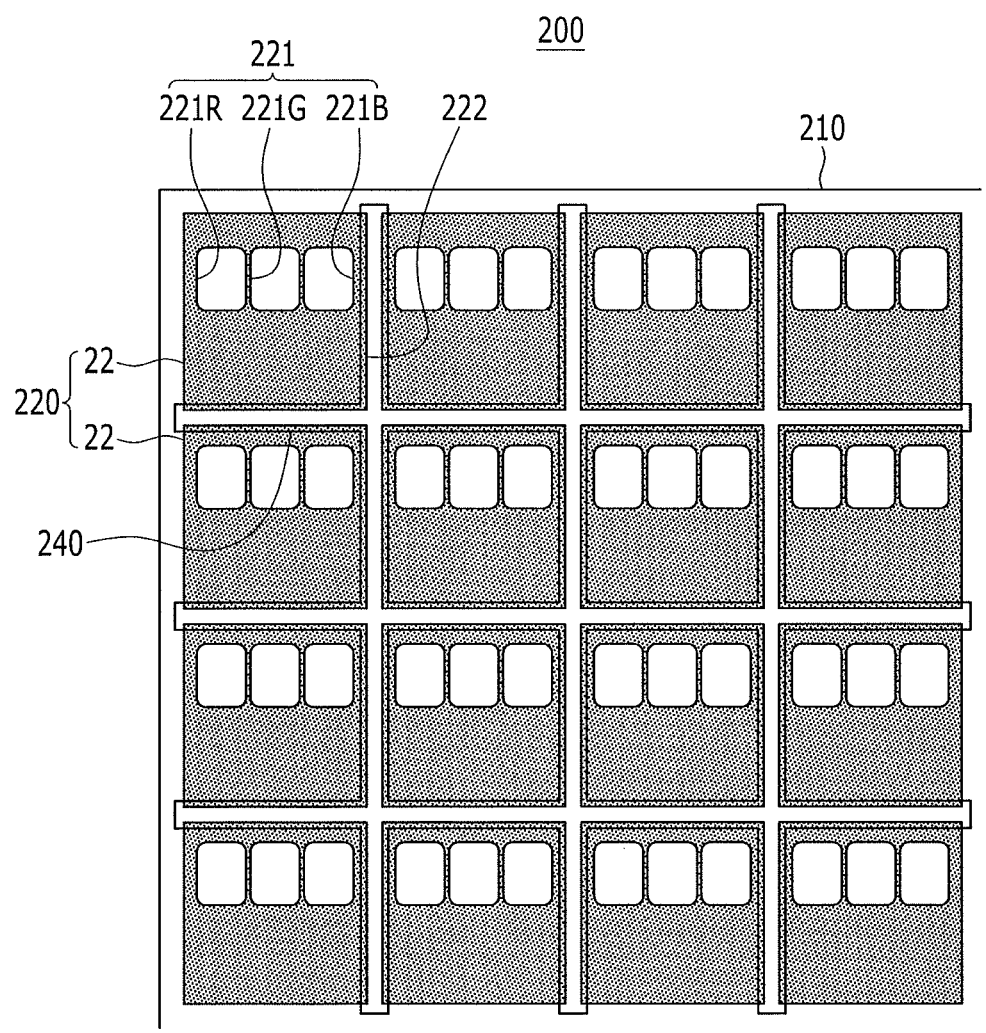
FIG. 8 illustrates a plan view of an encapsulation substrate of an organic light emitting diode display according to yet another exemplary embodiment.
Figure 9:
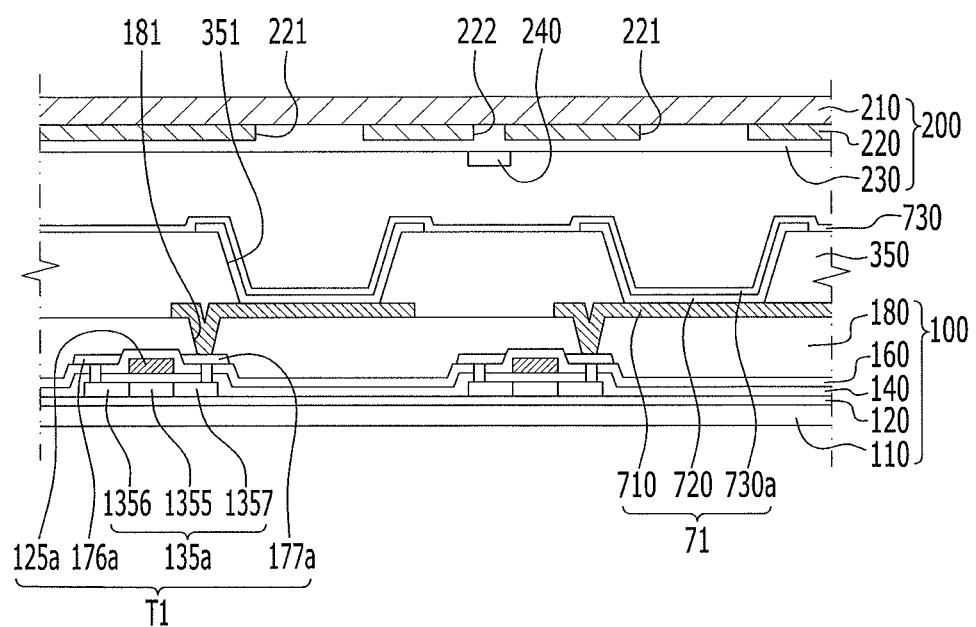
FIG. 9 illustrates a cross-sectional view taken along line IX-IX of FIGS. 7 and 8.

FIG. 7 illustrates a plan view of a display substrate of an organic light emitting diode display according to yet another exemplary embodiment, FIG. 8 illustrates a plan view of an encapsulation substrate of an organic light emitting diode display according to yet another exemplary embodiment, and FIG. 9 illustrates a cross-sectional view taken along line IX-IX of FIGS. 7 and 8. The organic light emitting diode display in FIGS. 7-9 is substantially the same as the organic light emitting diode display described previously with reference to FIGS. 2-4, except for the position of the auxiliary reflecting member. Descriptions of same elements will not be repeated.

As illustrated in FIGS. 7-9, the display substrate 100 of the organic light emitting diode display may include the first substrate 110 and the plurality of pixel light emitting units 71, which are formed on the first substrate 110 and allow the organic light emitting diode (OLED) to emit light. The pixel light emitting unit 71 may include the pixel electrode 710, which is the first electrode formed on the first substrate 110, the pixel defined layer 350, which covers the edge of the pixel electrode 710 and exposes the pixel electrode 710 through the pixel opening 351, the organic emission layer 720, which is formed on the pixel electrode 710, and the common electrode light emitting unit 730a, which is a part of the common electrode 730, which is the second electrode formed on the organic emission layer 720. The plurality of pixel light emitting units 71 may form the dot light emitting unit 80 which includes the red light emitting unit 71R which is the first color light emitting unit, the green light emitting unit 71G which is the second color light emitting unit, and the blue light emitting unit 71B which is the third color light emitting unit.

The encapsulation substrate 200 may include the second substrate 210, which faces the display substrate 100, the main reflecting member 220, which is formed on the second substrate 210, an overcoat 230 which covers the main reflecting member 220, and an auxiliary reflecting member 240, which is formed on the overcoat 230. In other words, as illustrated in FIG. 9, the overcoat 230 is between, e.g., separates, the main reflecting member 220 and the auxiliary reflecting member 240.

The main reflecting member 220 has the light emitting opening 221 at the position corresponding to the pixel light emitting unit 71, and the auxiliary opening 222 at a position enclosing the plurality of light emitting openings 221. The light emitting opening 221 includes the red light emitting opening 221R which corresponds to the red light emitting unit 71R, the green light emitting opening 221G which corresponds to the green light emitting unit 71G, and the blue light emitting opening 221B which corresponds to the blue light emitting unit 71B. The light emitted from the pixel light emitting unit 71 through the light emitting opening 221 is emitted to the outside. The auxiliary opening 222 has a net shape to divide the main reflecting member 220 into the plurality of sub-reflecting members 22.

The auxiliary reflecting member 240 is formed at a position corresponding to, e.g., overlapping, the auxiliary opening 222 and has the same net shape as the auxiliary opening 222. Therefore, the auxiliary reflecting member 240 is formed to enclose the light emitting opening 221. The auxiliary reflecting member 240 may be made of metal having high reflectance, e.g., silver (Ag), aluminum (Al), and magnesium (Mg).

In FIG. 8 the auxiliary reflecting member 240 has a net shape, but embodiments are not limited thereto. For example, the auxiliary reflecting member 240 may have a straight shape.

According to embodiments, it is possible to prevent the encapsulation substrate 200 from warping before and after a heat treatment process due to a difference in a coefficient of thermal expansion between the main reflecting member 220, e.g., made of metal, and the second substrate 210, e.g., made of glass, by forming the auxiliary opening 222, which divides the main reflecting member 220 into the plurality of sub-reflecting members 22, on the encapsulation substrate 200. Further, it is possible to facilitate the alignment between the auxiliary opening 222 and the auxiliary reflecting member 240 by minimizing the distance between the auxiliary opening 222 and the auxiliary reflecting member 240, i.e., by forming both of the auxiliary opening 222 and the auxiliary reflecting member 240 on the encapsulation substrate 200. Therefore, it is possible to minimize the deterioration of the reflecting function due to the auxiliary opening 222.

By way of summary and review, a conventional reflecting member installed on the encapsulation substrate has light emitting openings only at a position corresponding to a pixel opening formed on a pixel defined layer of the display substrate. However, since the conventional reflecting member is an integral type, i.e., a continuous and non-divided single member, when a heat treatment process is performed and then temperature is rapidly decreased, the encapsulation substrate may be warped due to a difference in the of thermal expansion between the reflecting member made of metal, and the like, and the encapsulation substrate made of glass, and the like.

In contrast, the organic light emitting diode display according to exemplary embodiments is capable of preventing the encapsulation substrate from warping due to the heat treatment process. That is, according to the exemplary embodiments, it is possible to prevent the reflecting function from deteriorating while preventing the encapsulation substrate from warping due to the main reflecting member, by forming an auxiliary opening dividing the main reflecting member into a plurality of sub reflecting members and forming an auxiliary reflecting member at the position corresponding to the auxiliary opening.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a display substrate including a first substrate and a plurality of pixel light emitting units on the first substrate;
   an encapsulation substrate including a second substrate facing the display substrate, and a main reflecting member on and in contact with the second substrate, the main reflecting member including:
   a light emitting opening at a position corresponding to at least one of the pixel light emitting units, and
   an auxiliary opening dividing the main reflecting member into a plurality of sub-reflecting members; and
   an auxiliary reflecting member at a position corresponding to the auxiliary opening, wherein the auxiliary reflecting member is on the first substrate and in contact with the display substrate.

2. The organic light emitting diode display as claimed in claim 1, wherein the auxiliary reflecting member encloses at least one of the pixel light emitting units.

3. The organic light emitting diode display as claimed in claim 2, wherein each of the auxiliary opening and the auxiliary reflecting member has a straight shape or a net shape.

4. The organic light emitting diode display as claimed in claim 2, wherein each of the auxiliary opening and the auxiliary reflecting member encloses the light emitting opening and the pixel light emitting unit.

5. The organic light emitting diode display as claimed in claim 2, wherein the plurality of pixel light emitting units includes a plurality of dot light emitting units, each dot light emitting unit including a first color light emitting unit, a second color light emitting unit, and a third color light emitting unit.

6. The organic light emitting diode display as claimed in claim 5, wherein each of the auxiliary opening and the auxiliary reflecting member encloses the light emitting opening and the dot light emitting unit.

7. The organic light emitting diode display as claimed in claim 5, wherein each of the auxiliary opening and the auxiliary reflecting member encloses the plurality of light emitting opening and the plurality of dot light emitting units.

8. The organic light emitting diode display as claimed in claim 2, wherein the pixel light emitting unit includes:
   a first electrode on the first substrate;
   an organic emission layer on the first electrode; and
   a second electrode on the organic emission layer, the auxiliary reflecting member being on a same layer as the first electrode.

9. The organic light emitting diode display as claimed in claim 8, wherein the auxiliary reflecting member is coplanar with the first electrode.

10. The organic light emitting diode display as claimed in claim 1, wherein the main reflecting member includes a plurality of individual sub-reflecting members defined by the auxiliary opening, the auxiliary reflecting member overlapping the auxiliary opening.

11. The organic light emitting diode display as claimed in claim 1, wherein the organic light emitting diode display is a top emission display.

12. A single-side emission organic light emitting diode display comprising:
   a display substrate including a first substrate and a plurality of pixel light emitting units on the first substrate;
   an encapsulation substrate including a second substrate facing the display substrate, and a main reflecting member on and in contact with the second substrate, the main reflecting member including:
   a light emitting opening at a position corresponding to at least one of the pixel light emitting units and
   an auxiliary, opening dividing the main reflecting member into a plurality of sub-reflecting members; and
   an auxiliary reflecting member at a position corresponding to the auxiliary, opening wherein the auxiliary reflecting member is on the second substrate, in contact with the encapsulation substrate and encloses at least one of the pixel light emitting units.

13. The organic light emitting diode display as claimed in claim 12, wherein each of the auxiliary opening and the auxiliary reflecting member has a straight shape or a net shape.

14. The organic light emitting diode display as claimed in claim 12, wherein each of the auxiliary opening and the auxiliary reflecting member encloses the light emitting opening.

15. The organic light emitting diode display as claimed in claim 12, wherein the plurality of pixel light emitting units includes a plurality of dot light emitting units, each dot light emitting unit including a first color light emitting unit, a second color light emitting unit, and a third color light emitting unit.

16. The organic light emitting diode display as claimed in claim 15, wherein each of the auxiliary opening and the auxiliary reflecting member encloses the light emitting opening.

17. The organic light emitting diode display as claimed in claim 15, wherein each of the auxiliary opening and the auxiliary reflecting member encloses the plurality of light emitting openings.

18. The organic light emitting diode display as claimed in claim 15, wherein the auxiliary reflecting member is on an overcoat, the overcoat covering the main reflecting member and overlapping the auxiliary opening.

* * * * *